United States Patent [19]

Prescott

[11] Patent Number: 5,199,603

[45] Date of Patent: Apr. 6, 1993

[54] DELIVERY SYSTEM FOR ORGANOMETALLIC COMPOUNDS

[76] Inventor: Norman F. Prescott, Four Fairview Ave., Wenham, Mass. 01984

[21] Appl. No.: 797,910

[22] Filed: Nov. 26, 1991

[51] Int. Cl.$^5$ ............................................. B67D 5/00
[52] U.S. Cl. ...................................... 222/3; 222/400.7; 222/630
[58] Field of Search ................ 222/3, 394, 399, 400.7, 222/630; 261/121.1; 251/331

[56] References Cited

U.S. PATENT DOCUMENTS

| | | | |
|---|---|---|---|
| 4,506,815 | 3/1985 | Melas et al. | 222/630 |
| 4,591,464 | 5/1986 | Kaneno et al. | 261/121.1 |
| 4,919,304 | 4/1990 | Markowicz | 222/630 X |
| 4,977,929 | 12/1990 | Chinnock et al. | 251/331 |

FOREIGN PATENT DOCUMENTS 104547  5/1942  Sweden .......................... 222/630

Primary Examiner—Andres Kashnikow
Assistant Examiner—Philippe Derakshani
Attorney, Agent, or Firm—Owen J. Meegan

[57] ABSTRACT

A cylinder and dip tube device including a container having an elongated cylindrical portion terminating in a bottom at one end and an open top at the other. A closure member covers the open top. A first inlet is formed in the closure member and extends from an inlet junction on a side wall of the closure member to an egress on the face. A first outlet is formed in the closure member and extends from an outlet junction on a side wall of the closure member to an ingress on the face. A second inlet is disposed in the closure member and extends from an inlet junction to an ingress on a side wall of the closure member. A second outlet is disposed in the closure member and extends from the outlet junction to an egress on a side wall of the closure member. A removable valve including a removable diaphragm is disposed therein covering each of the inlet junction and the outlet junction whereby to control the inflow and outflow of materials stored in the container. A dip tube is disposed within the container and extends from the egress of the first inlet to adjacent the bottom of the container. A filling device is disposed in the closure member to enable a user to fill the container.

13 Claims, 2 Drawing Sheets

DELIVERY SYSTEM FOR ORGANOMETALLIC COMPOUNDS

BACKGROUND OF THE INVENTION

The present invention relates to devices for transferring organometallic compounds from a container of such compounds to a deposition system. In particular, the present invention relates to a new and improved closure member which includes an in-head delivery system with removable valves for a cylinder containing such compounds which enables the reuse and shipment of the device after refilling.

DESCRIPTION OF THE PRIOR ART

In the U.S. Pat. No. 4,506,815 to Meals et al, a bubbler cylinder with a dip tube is disclosed in which pipes and valves extend outwardly from a cylinder head to provide for the inflow and outflow of gases and organometallic compounds. The valves are connected to the cylinder through pipes that are welded to the cylinder and enable the discharge of the organometallic materials therefrom. Filling of the container is accomplished through an inlet prior to sale and shipment. Unfortunately, however, the container of the prior art can only be used once and can not be refilled according to United States Department of Transportation regulations for the transportation of hazardous material which classifies the container as non-reusable. Since such containers are made of stainless steel and require significant amounts of machining and welding to make them, the prohibition against re-use produces an unnecessary expense which should be avoided. Moreover, the device of the prior art is fairly large and has bulky pipes and valves extending outwardly from it which also make it difficult to handle, transport and store. Moreover, such pipes can also contribute to contamination of the compounds in the container because when the valves are closed, the compounds can condense on the pipes behind the valves and degrade the purity of material being used.

SUMMARY OF THE INVENTION

According to the present invention I have discovered an in-head delivery system which includes a cylinder and dip tube and a container having an elongated cylindrical portion that terminates in a flat bottom at one end and an open end at the other. A closure member with the in-head delivery system is disposed on the open end of the container, the closure member having a face which covers the open end. The closure member also includes side walls which define its perimeter. A first inlet is disposed in the closure member and extends from an inlet junction to an egress on the face of the closure member. A first outlet is also disposed in the closure member, the first outlet extending from an outlet junction to an ingess on the face of the closure member. A second inlet is disposed in the closure member and it extends from the inlet junction to an ingress on the closure member. A second outlet is disposed on the closure member and it extends from the outlet junction to an egress on the closure member. A valve is disposed over each of the inlet and outlet junctions to control the inflow and outflow of gasses and materials stored in the container. A dip tube is disposed within the container and extends from the egress of the first inlet to a point adjacent the bottom of the container. Preferably, the junctions are circular and egress of the first inlet and the ingress of the first outlet are disposed along the center line of the circle. A flexible, circular, disposable diaphragm is disposed in each of the circular junctions. The centers of the diaphragms are adapted to urge against the centers of the junctions to form a seated closure to block off flow. The diaphragms are removably disposed within the junctions so that they may be discarded after use of the device prior to refilling of the container. Bonnets cover the diaphragms and a valve stem in each bonnet can urge against the centers of the diaphragms so as to stop the flow of fluids.

DESCRIPTION OF THE PREFERRED EMBODIMENT

Figure 1:
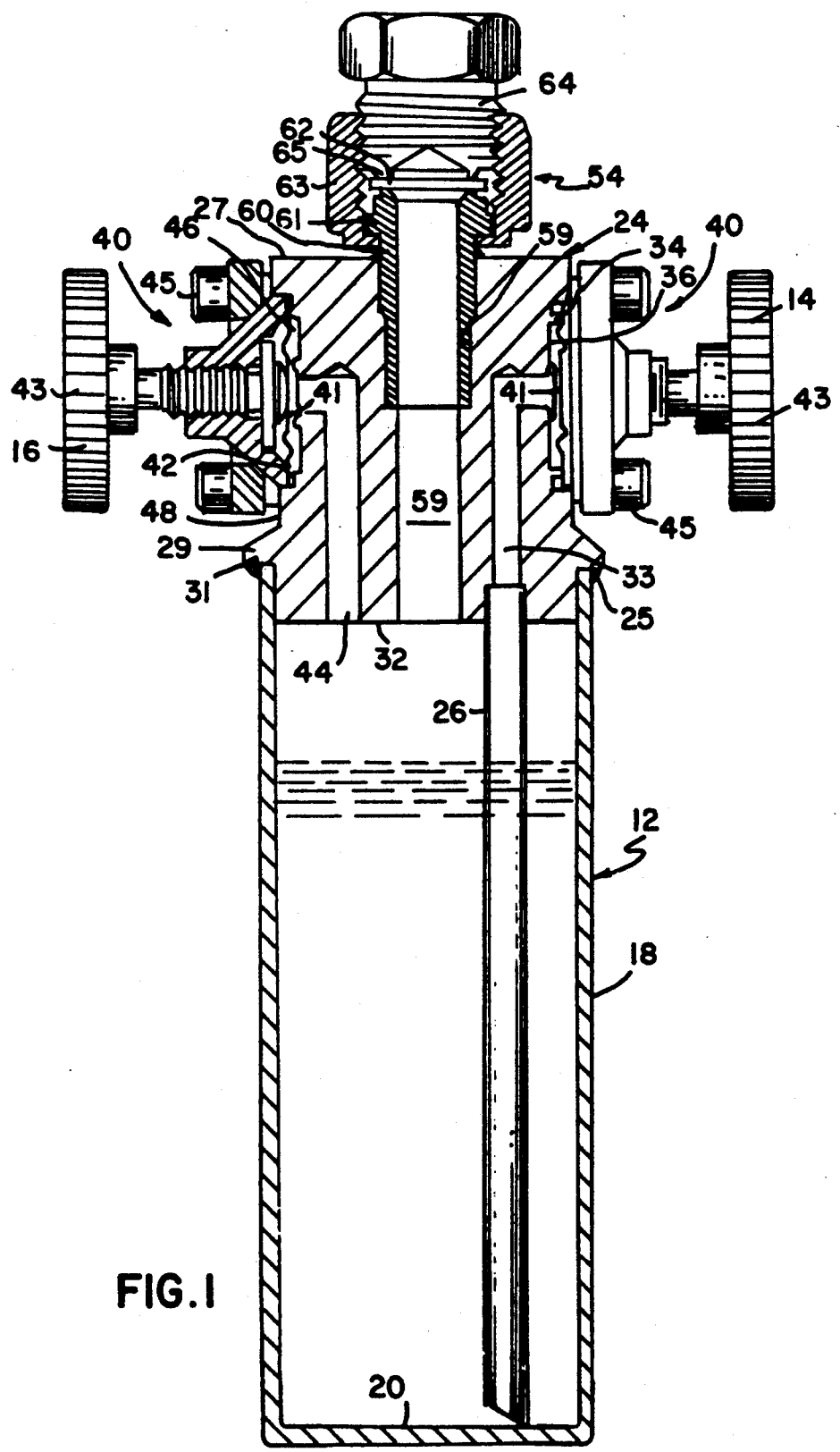
FIG. 1 is a cross sectional elevational view of the bubbler cylinder and dip tube device of the present invention.

FIG. 1 shows the preferred embodiment of the present invention. The view shows a cylinder and dip tube system for transferring organometallic materials contained within the cylinder to a deposition system. The device includes a vertically elongated closed cylinder or container 12 with a closure member 24 having disposed thereon a bolted bonnet-type controllable inlet valve 14 and outlet valve 16, both of which can be identical. The cylinder 12 comprises a cylindrical elongated member 18 having a substantially uniform cross-section throughout its length and a circular bottom member 20. The circular bottom 20 is flat so as to enable the device to be used and placed in shipping containers easily. The entire inside of the cylinder 18 and portions of the closure member 24 may coated with a baked-on coating of Teflon to prevent contamination of the organometallic compound.

The closure member 24 is attached with a weld 25 to the open end of the container 18 to prevent the loss of organometallic materials contained within the cylinder. The closure member 24 can have any desired external shape, so long as the holes can be drilled in it. In the embodiment shown, a cubic shaped top section 27 is illustrated but cylindrical shapes function equally well. In the case of the cubic shaped top, it is disposed upon a cylindrically shaped bottom section 29. A flange 31 is disposed around the cylindrically shaped bottom 29 so as to provide an engagement means for the weld 25. A face 32 is disposed on the lower surface of the bottom section 29.

A bore constituting a part of a first inlet means 33 is drilled between the face 32 of the closure member 24 and a point distantly removed therefrom within the closure member 24. Another bore is a drilled at right angles to the above mentioned bore to complete a passageway between the inside of the container 18 and the center of an inlet junction 36. A Teflon or stainless steel dip tube 26 is disposed at the egress of the first inlet means 33 and it extends to near the bottom 20 of the container 18.

Figure 2:
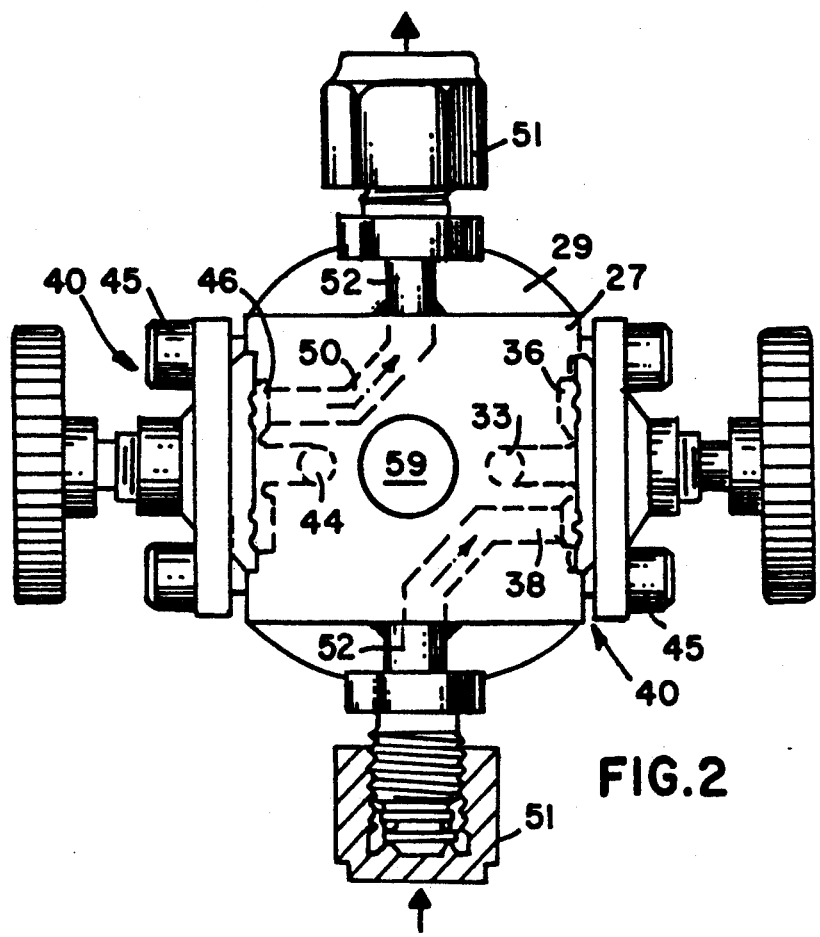
FIG. 2 is a top view of the device shown in FIG. 1.
Figure 3:
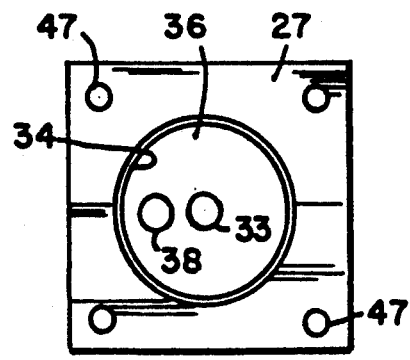
FIG. 3 is a view of the side of the device of the present invention with the valve assembly removed

As shown in FIGS. 2 and 3, a second inlet means 38 at a radially offset location within the inlet junction 36. To form the second inlet means 38 a bore is drilled within the closure member 24 between the radially offset location and an internal point. A second bore is angularly drilled between the side wall 40 and internal point to form a passageway constituting the second inlet means 38. A flange 34 having a circular shape is disposed around the perimeter of the inlet junction 36.

A bore forming a first outlet means 44 is drilled between the face 32 of the closure member 24 and a point distantly removed therefrom within the closure member 24 and another bore is a drilled at right angles to this bore to complete a passageway between the inside of the container 18 and the center of an outlet junction 46. A second outlet means 50 is formed between a radially offset location within the outlet junction 46. As with the first outlet means 38, to form the second outlet means 38 a bore is drilled within the closure member 24 between the radially offset point and an internal point. Another bore is angularly drilled between the side wall 48 and internal point to form a passageway constituting the second inlet means 50.

Two bonnet-type valves 40 are bolted onto the side walls of the closure member 24. They are preferably spaced from each other by 180°. Circular diaphragms 41 held with the bonnet valves and are fitted into the junctions 36 and 46 and held in place with a flange 42 that engages both a side wall of the closure member 24 and the diaphragm 41. The diaphragm 41 is metal with corrugations spaced circularly about the center that assist in the movement and flexibility of the diaphragm when it is moved to the valve seat by the stem. The diaphragm 41 is of a stiffness such that it returns to an open position when the stem is backed off. The stiffness is also sufficient to maintain an open position even with full vacuum on the interior of the valve. With these parameters, the diaphragm 41 can be urged against the ingress of the first inlet means 33 or the egress of the first outlet means 44 to stop the flow of gases therethrough by turning a handle 43 which in turn engages a nose at the end of the valve stem to urge the diaphragm 41 against the ingress or the egress.

The valves are attached to the side wall 48 of closure member 24 by means of bolts 45 that are screwed into tapped holes 47, shown in FIG. 3. To remove the valves from the device, the bolts 45 are unscrewed and then the diaphragm 41 can be removed from the junctions 36 and 46.

As shown in FIG. 2, the ingress of second inlet means 38 and the egress of second outlet means 50 are attached to pipes 50 that are welded to the side wall 48 of the closure member 24. Conventional union joints 51 are fitted on the end of pipes 52 so as to provide connections to the incoming gas line and the outgoing product line.

A filling plug 54 is fitted into a bore 59 in the closure member 24 to enable the manufacturer and shipper of the product to fill and refill the container with the organometallic compounds. The bore 59 is drilled through the top wall of the closure member 24 and a stainless steel pipe 60 is fitted and welded to it. The stainless steel pipe 60 can be of any convenient length, as desired. A valve head 61 is machined on the top of pipe 60 to provide a seat for a replaceable steel gasket 62. A union nut 63 is slip fitted over pipe 60 and engages the bottom of head 61. A blank cap nut 64 is threaded into the inside of union nut 63 and a ring 65 on its end engages the top of gasket 62 to seal the container. In some cases it may be desirable to join the functions of the first outlet means 44 and the bore 59, in which case the bore immediately adjacent the diaphragm 41 forming a portion of the first outlet means is simply drilled entirely through to the bore 59. The bore 44 which is parallel to the bore 59 can thus be eliminated and exiting materials will simply flow out bore 59 into outlet junction 46.

To refill the container, the device can be back flushed with conventional materials to clean it. After back flushing, a new diaphragm can be placed beneath the valve cover and the inside of the container can be inspected for any breaks in the conventional internal baked-on coating of Teflon. If a break in the Teflon coating is discovered, a second coat of Teflon can be placed on the inside of the container through conventional means using a spraying attachment which is fitted through the filling mechanism 54.

It is apparent that modifications and changes can be made within the spirit and scope of the present invention but it is my intention, however, to be limited only by the scope of the appended claims.

As my invention I claim:

1. A reusable cylinder and dip tube device for organometallic compounds comprising:
   a container having an elongated cylindrical portion terminating in a bottom at one end and an open top at the other;
   a closure member covering said open top, said closure member having sidewalls and an internal face covering said open top;
   an inlet junction disposed in one of said sidewalls;
   a first inlet means disposed in said closure member, said first inlet means extending from said inlet junction to an egress on said face;
   an outlet junction disposed in one of said sidewalls;
   a first outlet means disposed in said closure member, said first outlet means extending from said outlet junction to an ingress on said face;
   a second inlet means disposed in said closure member, said second inlet means extending from said inlet junction to an ingress on a sidewall of said closure member;
   a second outlet means disposed in said closure member, said second outlet means extending from said outlet junction to an egress on a sidewall of said closure member;
   valve means for each of said inlet junction and said outlet junction, said valve means including a removable, resilient, metallic diaphragm disposed in each of said inlet junction and said outlet junction, one of said diaphragms being normally open and resiliently urgeable against the ingress of the first inlet means and the other of said diaphragms being normally open and resiliently urgeable against the ingress of the first outlet means, said valve means further including means to urge a portion of each of the diaphragms against the ingress of said first inlet and the egress of said first outlet means, whereby to control the inflow and outflow of materials to and from said container;
   a dip tube disposed within said container and extending from the egress of said first inlet means to adjacent the bottom of said containers;
   filling means disposed in said closure member to enable a user to fill said container.

2. The device according to claim 1 wherein said junctions are circular and said first inlet means and said first outlet means terminate at the center thereof.

3. The device according to claim 2 wherein the center of said diaphragms are arranged to urge against the respective centers of said junctions whereby to stop the flow of materials through said junctions.

4. The device according to claim 1 wherein said valve means further includes bonnets covering said diaphragms, said bonnets being bolted to the sidewalls of said closure member, whereby to enable a user to unbolt said bonnets to remove the diaphragms for replacement and cleaning of components of the device.

5. The device according to claim 1 wherein said closure member has a top wall, said filling means being a through hole extending from said top wall to said internal face, and means to close said filling means whereby to seal said container.

6. The device according to claim 1 wherein said closure member is welded to said cylinder.

7. A reusable cylinder and dip tube device for storing organometallic compounds comprising:
- a container having an elongated cylindrical portion terminating in a bottom at one end and an open top at the other end;
- a closure member disposed on said open top of said container, said closure member having an internal face covering said open top and having sidewalls to define its body;
- first inlet means disposed in said body, said first inlet means extending from an ingress on said sidewall to an egress on said face;
- first outlet means disposed in said body, said first outlet means extending from an ingress on said face to an egress on said sidewall;
- second inlet means disposed in said body, said second inlet means extending from an egress on said sidewall to an ingress on said sidewall;
- second outlet means disposed in said body, said second outlet means extending from an ingress on said sidewall to an egress on said sidewall;
- an inlet junction disposed on said sidewall, said inlet junction communicating with the ingress of said first inlet means and the egress of said second inlet means;
- an outlet junction disposed on another of said sidewalls, said outlet junction communicating with the egress of said first outlet means and the ingress of said second outlet means;
- a valve means including internally disposed, resilient, metallic diaphragms covering each of said inlet junction and said outlet junction whereby to control the inflow and outflow of materials stored in said container, said valve means including bonnets covering said diaphragms, said bonnets being bolted to said closure member, whereby to enable a user to unbolt said bonnets to remove the diaphragms,
- means in said bonnets to urge each of said diaphragms against respective junctions to provide closures for said container;
- a dip tube disposed within said container and extending from the egress of said first inlet means to adjacent the bottom of said container.

8. The device according to claim 7 wherein said junctions are each circular and said ingress of said first inlet means is disposed at the center of one of the circles and the egress of said first outlet means is disposed at the center of another of said circles and the egress of said second inlet means and the ingress of said second outlet means are each disposed on a radius of the circular junction and removed from the center of said circles.

9. The device according to claim 8 further including means to urge the center of the diaphragms against the respective centers of said junctions.

10. The device according to claim 7 wherein said diaphragms are removably disposed within said junctions whereby to enable a user to remove said diaphragms from said junctions after use of the device.

11. The device according to claim 7 further including filling means to fill said container through said closure member.

12. The device according to claim 11 wherein said closure member has an external face, said filling means being a through hole extending from said external face to said internal face, and means to close said filling means whereby to seal said container.

13. The device according to claim 7 wherein said closure member is welded to said cylinder.

* * * * *